United States Patent [19]

Erickson

[11] Patent Number: 4,732,108

[45] Date of Patent: Mar. 22, 1988

[54] APPARATUS FOR MONITORING EPITAXIAL GROWTH

[75] Inventor: L. Peter Erickson, Minneapolis, Minn.

[73] Assignee: The Perkin-Elmer Corporation, Norwalk, Conn.

[21] Appl. No.: 900,568

[22] Filed: Aug. 26, 1986

[51] Int. Cl.⁴ .......................................... H01L 21/203
[52] U.S. Cl. ..................................... 118/713; 118/730
[58] Field of Search ...................... 118/712, 713, 730; 427/9

[56] References Cited

U.S. PATENT DOCUMENTS 3,019,336 1/1962 Johns ....................................... 427/9
4,575,462 3/1986 Dobson et al. .......................... 427/9

Primary Examiner—John P. McIntosh
Attorney, Agent, or Firm—H. S. Ingham; F. L. Masselle; E. T. Grimes

[57] ABSTRACT

The present invention is directed to apparatus for monitoring epitaxial crystalline growth mounted in a vacuum chamber, said apparatus including a support for mounting a single crystal substrate surface, a device for applying epitaxial material to the substrate surface, a device for impinging an electron beam upon the substrate surface to emit secondary electrons therefrom, and a system for detecting the secondary electrons emitted and for outputting a corresponding signal.

10 Claims, 4 Drawing Figures

APPARATUS FOR MONITORING EPITAXIAL GROWTH

FIELD OF THE INVENTION

The present invention relates to apparatus for monitoring epitaxial crystalline growth, and more particularly to such crystalline growth effected in a vacuum, which is high enough to operate an electron gun. It is particularly useful, among other possible applications, for measuring the epitaxial crystalline growth rate during molecular beam epitaxy.

BACKGROUND OF THE INVENTION

Herefore, one of the frequently used means for measuring deposition in general, not necessarily crystal growth, involved the use of a so called quartz crystal monitor which was mounted adjacent the sample so that material was deposited on the quartz crystal simultaneously with the sample. The change in electrical frequency of the quartz crystal indicated how much material had been deposited. This technique for measuring deposition of crystal growth was difficult to use because what is deposited on the quartz crystal is not necessarily indicative of the crystal growth rate on the sample or substrate, particularly because the substrate was hot and the quartz crystal monitor was cold.

Another prior art technique for monitoring crystalline growth involved the use of electron diffraction to generate a diffraction pattern on a phosphor screen. In the diffraction-type type process an electron beam was directed to impinge on the sample at a very shallow angle and then opposite the electron gun on the other side of the sample a phosphor screen was mounted, whereby the electrons hit the sample at a very shallow angle and diffracted through the top layers of the crystal to produce a diffraction pattern on the screen. The present invention is an improvement over such prior art techniques.

SUMMARY OF THE INVENTION

Briefly, the present invention is directed to a new and improved apparatus for monitoring epitaxial crystalline growth mounted in a vacuum, which includes means for mounting a crystal substrate surface, means for applying epitaxial material to the substrate surface, and means for impinging an electron beam upon the substrate surface to emit secondary electrons therefrom. In addition, the apparatus includes means for detecting the secondary electrons emitted and for outputting a corresponding signal. According to one aspect of the invention the means for applying epitaxial material to the substrate comprises molecular beam epitaxy means. In one form of the invention the means for detecting the secondary electrons emitted includes an electron multiplier, while in another form of the invention it comprises a secondary electron detector, which outputs an electrical signal, and the apparatus includes means for measuring the detected secondary electron current as a function of time.

According to an aspect of the invention the corresponding signal comprises periodic oscillations due to the periodic change in epitaxial layer completeness, and the apparatus includes means for displaying said periodic oscillations. Still, according to an aspect of the invention, the means for impinging an electron beam upon the substrate is a scanning electron gun, which is disposed about normal to the substrate surface, and the substrate is rotatable.

Further, according to another embodiment of the invention the electron gun and the secondary electron detector are mounted coaxially and perpendicular to the surface of the single crystal substrate.

There has thus been outlined rather broadly the more important features of the invention in order that the detailed description thereof that follows may be better understood, and in order that the present contribution to the art may be better appreciated. There are, of course, additional features of the invention which will be described hereinafter and which will form the subject of the claims appended hereto. Those skilled in the art will appreciate that the conception upon which the disclosure is based may readily be utilized as a basis for the designing of other apparatus for carrying out the several purposes of the invention. It is important, therefore, that the claims be regarded as including such equivalent apparatus as do not depart from the spirit and scope of the invention.

Several embodiments of the invention have been chosen for purposes of illustration and description, and are shown in the accompanying drawings, forming a part of the specification.

DETAILED DESCRIPTION OF THE PRESENTLY PREFERRED EMBODIMENTS OF THE INVENTION

Figure 1:
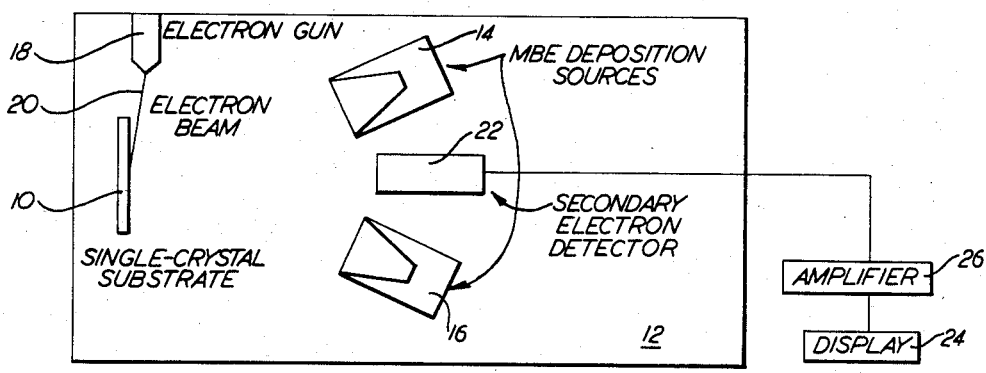
FIG. 1 is a schematic diagram of a molecular beam epitaxy system showing apparatus for monitoring the epitaxial growth, constructed according to the concepts of the present invention.

The growth monitoring device described herein is applicable to molecular beam epitaxy and any other epitaxial process which is compatible with the placement of an electron gun accessible to the substrate surface and a secondary electron detector. Referring to FIG. 1, a single-crystal substrate surface 10 is provided in a vacuum chamber 12 having a vacuum sufficient to operate an electron gun such as, for example, a vacuum of the order of about $10^{-8}$ Torr, or less, for molecular beam epitaxy. Other epitaxial growth techniques may tolerate high pressures. Any suitable single crystal substrate material may be employed such as, for example, silicon, gallium arsenide, indium phosphide, cadmium and telluride, and single crystal metals. Means are provided for applying epitaxial material to the substrate such as molecular beam sources 14, and 16. Thus, beams of molecules are made to strike the single-crystalline substrate in a vacuum, which gives rise to crystalline layers whose crystallographic orientation is related to that of the substrate. The molecular beam epitaxy deposition source is in essence a crucible with a resistive filament wrapped around it for heating purposes. When the crucible is heated sufficiently the material evaporates. The molecular beam deposition apparatus could, for example, be a model 06-460 or 06-402, or 06-420, and/or 06-200 as commercially supplied by The Perkin-Elmer Corporation.

Still referring to FIG. 1, the apparatus further includes an electron gun 18 which emits a beam of electrons 20 that impinge upon the substrate surface 10 to emit secondary electrons therefrom. A suitable electron beam gun could, for example, be a part No. A 79123 as commercially supplied by The Perkin-Elmer Corporation. Means 22 are provided for detecting the secondary electrons emitted and for outputting a corresponding signal. A simple metal plate detector is suitable. The secondary electron emission may also be detected using an electron multiplier, if desired. A suitable electron multiplier is commercially supplied by The Perkin-Elmer Corporation, as Model No. 04-201 or 04-202 with a Model 20-075-04 electron multiplier supply.

The output from the secondary electron detector 22 is connected to a suitable display device 24 through an amplifier circuit 26.

Figure 4:
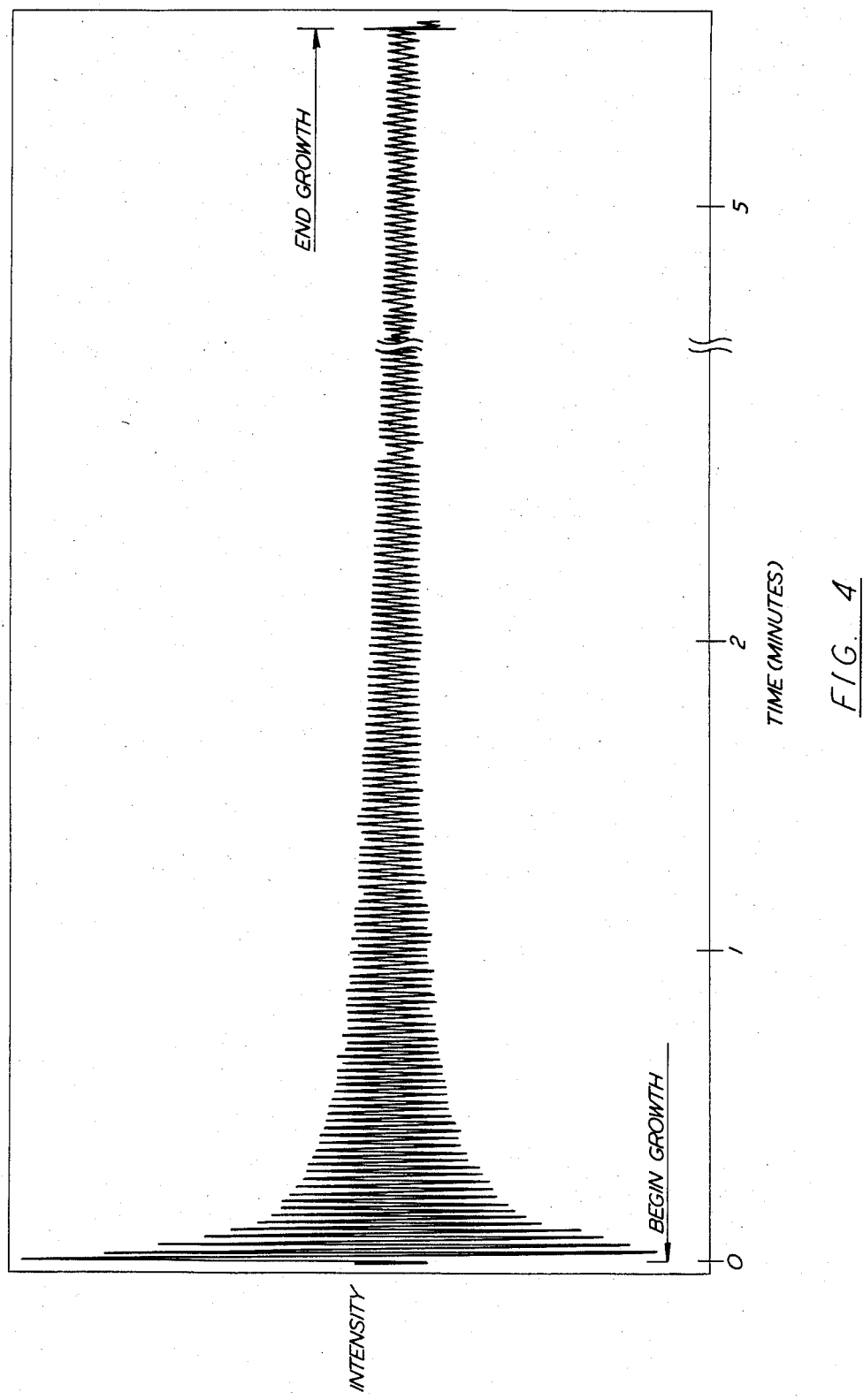
FIG. 4 is trace of the secondary electron emission oscillations measured over a period of time from the onset of epitaxial crystalline growth to its termination.

In operation, upon initiation of epitaxial growth upon the substrate, periodic oscillations in secondary electron emission is observed on the display device 24, due to the periodic changes in epitaxial layer completeness as each monolayer of epitaxial material is grown. One oscillation period corresponds to one monolayer of epitaxial crystal. As an example, an 8-10 kv electron beam 20 was directed to impinge upon the substrate 10 at an angle of less than about 2°. The secondary electron detector 22 was located about normal to the substrate or at an angle of about 24° from the normal. Two types of detectors where used: A Be-Cu discrete dynode electron multiplier and a simple plate detector. The electron multiplier was run at about 2-3 kv, and the output signal was directed to a strip chart recorder. The plate detector was used without bias and connected to a Keithley Model 485 picoammeter, followed by an amplifier and recorder, or to a Keithley Model 427 current amplifier and strip chart recorder. In some cases high and low pass filters where used to remove noise and drift from the signal. FIG. 4 shows a trace of the secondary electron emission oscillations over a period of 5.5 minutes from the onset of GaAs growth to its termination. A total of 223 oscillations in this case were counted. A band pass filter with a pass frequency range of approximately 0.2 Hz to 10 Hz was used to eliminate slow drift in the signal background level and to reduce higher frequency noise. For the trace in FIG. 4, a simple plate detector without bias was used. Signal level at the plate detector was about 9 nanoamperes, including both the DC and the oscillating components of the signal. Generally, the DC level was about 10 to 100 times greater than the peak-to-peak oscillation intensity.

The secondary electron emission oscillations are used to measure the epitaxial growth rate. Each monolayer oscillation is indicative of about 2.83 Å of GaAs or AlAs growth.

Figure 2:
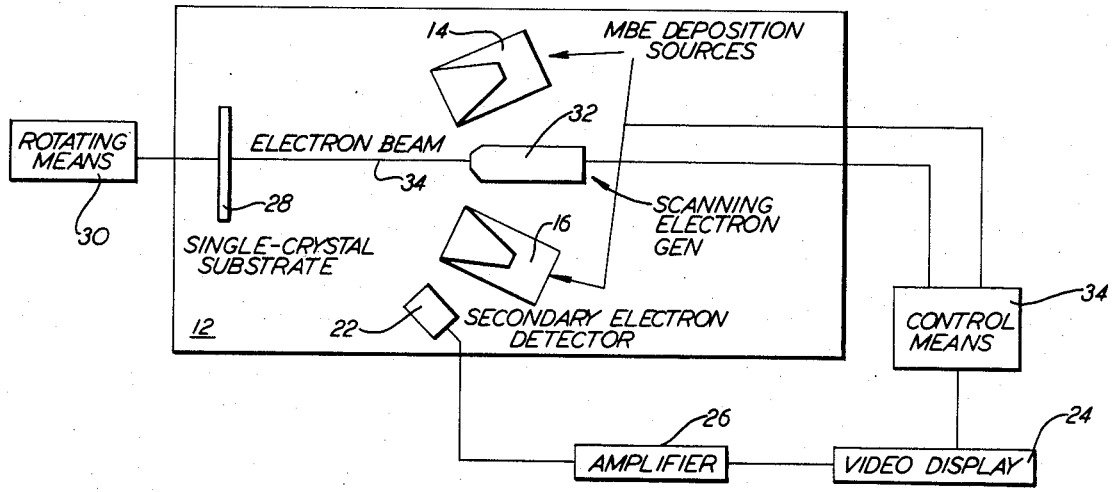
FIG. 2 is a schematic diagram similar to FIG. 1, but showing a second embodiment of apparatus for monitoring the epitaxial growth according to the invention.

Referring next to the embodiment of FIG. 2, a single-crystal substrate 28 is mounted for rotation by a suitable rotating means 30. Means are provided for applying epitaxial material to the substrate surface such as molecular beam epitaxial sources 14 and 16, in the same manner as that described in connection with the embodiment of FIG. 1. An electron gun 32 is provided which emits a beam of electrons 34 that impinge upon the substrate 28 to emit secondary electrons therefrom. Means 22 are provided for detecting the secondary electrons emitted and for outputting a corresponding signal in the same manner as that described in connection with the embodiment of FIG. 1. In this embodiment, preferably, the detector is disposed at an angle of about 45° with respect to the substrate 28. The output from the secondary electron detector 22 is connected to a suitable display device 24 through an amplifier circuit 26, also as described hereinbefore in connection with the embodiment of FIG. 1. Control means 34 are provided which coordinate the functions of the scanning electron gun 32 the molecular beam epitaxy deposition means 14, 16 and the video display 24. The system is mounted in a vacuum chamber, as indicated at 12 in FIG. 2, which is sufficient to operate the electron gun 32.

In the embodiment of FIG. 2, the electron gun 32 is in the form of a scanning electron gun which is mounted perpendicular to the substrate 28. The use of a scanning electron beam allows secondary electron emission imaging, resulting in the observation of oscillations in image intensity during the completion of each epitaxial monolayer. Such imaging allows for the observation of apparent rings upon the substrate surface corresponding to each half-monolayer of epitaxial film growth and is useful as a determination of epitaxial layer uniformity, because highly uniform deposition results in few or no ring patterns and nonuniform deposition has closely spaced ring patterns. The placement of the electron beam perpendicular to and at the substrate center allows for the observation of the above-described secondary electron emission oscillation even while the substrate 28 is rotating, and hence makes this technique useful for epitaxial growth rate monitoring, when substrates are being rotated for high uniformity of deposition. In addition to the uses described above, the stimulation and detection of secondary electron emission from a substrate prior to and during epitaxial film growth provides information about substrate surface conditions which may alter the secondary electron emission characteristics of the substrate surface. As an example, the change in secondary electron emission intensity as a surface oxide on the substrate is caused to desorb by thermal heating. Other substrate surface conditions to which the emission of secondary electrons may be sensitive include substrate temperature, alloy composition of the epitaxial layer being grown, and process conditions such as level of an overpressure of a constituent of the epitaxial crystal, for example.

Figure 3:
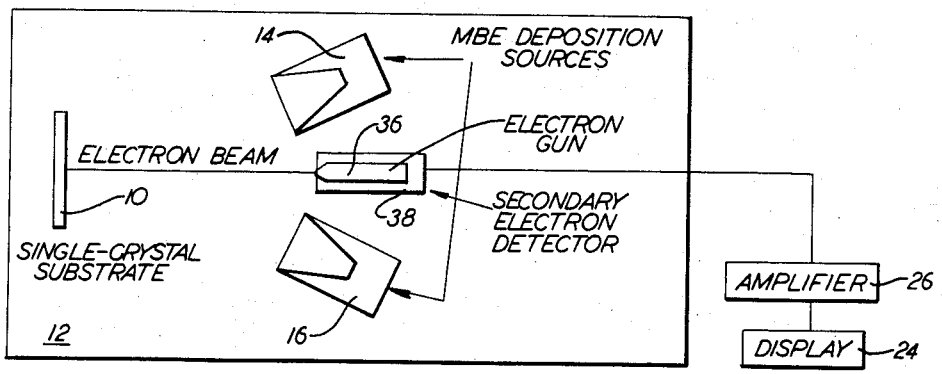
FIG. 3 is a schematic diagram similar to FIGS. 1 and 2, but showing a third embodiment of the invention.

FIG. 3 shows another embodiment of the invention, which includes a single crystal substrate 10, and molecular beam epitaxial sources 14 and 16, which operate in the same manner as those described in connection with the embodiment of FIG. 1. This embodiment makes use of a coaxially arranged electron gun 36 and a secondary electron detector 38, both being disposed normal to the plane of the single crystal substrate 10, as shown in FIG. 3. The electron gun 36 functions in the same manner as electron gun 18, as described in connection with the embodiment of FIG. 1. The secondary electron detector 38 is connected to a suitable display device 24 through an amplifier circuit 26 in the same manner as described hereinbefore in connection with the embodiment of FIG. 1. The system is mounted in a vacuum chamber 12 having a vacuum sufficient to operate the electron gun 36.

Although specific embodiments have been illustrated and described, it will be obvious to those skilled in the art that various modifications may be made without departing from the spirit and scope of the invention, which is to be limited solely by the appended claims.

What is claimed is:

1. Apparatus for monitoring epitaxial crystalline growth comprising, in combination:
    first means for mounting a single crystal substrate surface;
    second means for applying epitaxial material to said substrate surface;
    third means for impinging an electron beam upon said substrate surface to emit secondary electrons therefrom, said third means comprising a scanning electron gun disposed about normal to said substrate; and fourth means for detecting said secondary electrons emitted and for outputting a corresponding signal;
    said first means, second means, third means and fourth means being mounted in a vacuum chamber.

2. Apparatus for monitoring epitaxial crystalline growth according to claim 1 wherein said second means for applying epitaxial material to said substrate surface comprises molecular beam epitaxy means.

3. Apparatus for monitoring epitaxial crystalline growth according to claim 1 wherein said fourth means for detecting said secondary electrons emitted comprises an electron multiplier.

4. Apparatus for monitoring epitaxial crystalline growth according to claim 1 wherein said fourth means for detecting said secondary electrons emitted comprises a secondary electron detector which outputs an electrical signal, and said apparatus further including means for measuring the detected secondary electron current as a function of time.

5. Apparatus for monitoring epitaxial crystalline growth according to claim 1 wherein said corresponding signal comprises periodic oscillations due to periodic changes in epitaxial layer completeness and said apparatus includes means for displaying said periodic oscillations.

6. Apparatus for monitoring epitaxial crystalline growth according to claim 1 wherein said scanning electron gun is directed at about the center of said substrate.

7. Apparatus for monitoring epitaxial crystalline growth according to claim 6 further including means for rotating said substrate.

8. Apparatus for monitoring epitaxial crystalline growth according to claim 1 wherein said third means for impinging an electron beam upon said substrate and said fourth means for detecting said secondary electrons emitted are mounted coaxially with respect to each other.

9. Apparatus for monitoring epitaxial cyrstalline growth according to claim 1 wherein said vacuum chamber is maintained at a vacuum of the order of about $10^{-8}$ Torr.

10. Apparatus for monitoring epitaxial crystalline growth comprising, in combination:
    first means for mounting a single crystal substrate surface;
    second means for applying epitaxial material in successive monolayers to said substrate surface;
    third means for impinging an electron beam upon said monolayers to emit secondary electrons therefrom;
    fourth means for detecting said secondary electrons emitted and for outputting a corresponding signal having periodic oscillations corresponding to the completion of each successive monolayer; and
    fifth means for displaying said periodic oscillations;
    wherein said third means comprises a scanning electron gun, disposed about normal to said substrate such that said fifth means displays an image of said monolayers, said image having oscillations in intensity corresponding to said periodic oscillations and thereby corresponding to the completion of said successive monolayer;
    said first means, second means, third means and fourth means being mounted in a vacuum chamber.

* * * * *